(12) United States Patent
Shtein et al.

(10) Patent No.: US 8,155,497 B2
(45) Date of Patent: Apr. 10, 2012

(54) FIBER-BASED ELECTRIC DEVICE

(75) Inventors: Max Shtein, Ann Arbor, MI (US); Kevin P. Pipe, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 13/154,186

(22) Filed: Jun. 6, 2011

(65) Prior Publication Data

US 2011/0308077 A1 Dec. 22, 2011

Related U.S. Application Data

(63) Continuation-in-part of application No. 12/253,310, filed on Oct. 17, 2008, now Pat. No. 7,970,242.

(60) Provisional application No. 60/999,527, filed on Oct. 18, 2007.

(51) Int. Cl.
*G02B 6/10* (2006.01)

(52) U.S. Cl. ........... 385/147; 385/14; 385/101; 385/901

(58) Field of Classification Search .................... 385/14, 385/101, 147, 901
See application file for complete search history.

(56) References Cited

U.S. PATENT DOCUMENTS

| | | | |
|---|---|---|---|
| 4,365,865 | A | 12/1982 | Stiles |
| 5,268,971 | A | 12/1993 | Nilsson et al. |
| 6,304,700 | B1 | 10/2001 | Brand et al. |
| 6,490,402 | B1 | 12/2002 | Ota |
| 6,697,191 | B2 | 2/2004 | Kiryuschev et al. |
| 6,859,594 | B2 | 2/2005 | Cheng et al. |
| 7,164,820 | B2 | 1/2007 | Eves et al. |
| 7,496,249 | B2 | 2/2009 | Mates |
| 7,535,019 | B1 | 5/2009 | Sager et al. |
| 7,845,023 | B2 | 12/2010 | Swatee |
| 7,894,694 | B2 * | 2/2011 | Gaudiana et al. ............. 385/101 |
| 2005/0040374 | A1 | 2/2005 | Chittibabu et al. |

* cited by examiner

*Primary Examiner* — Daniel Petkovsek

(74) *Attorney, Agent, or Firm* — Harness, Dickey & Pierce, P.L.C.

(57) ABSTRACT

A method of manufacturing a fiber-based electric apparatus includes providing an elongate, flexible fiber core and layering an electric device on the fiber core.

20 Claims, 13 Drawing Sheets

FF = (A) / ($V_{oc} \cdot I_{sc}$)

FIBER-BASED ELECTRIC DEVICE

CROSS REFERENCE TO RELATED APPLICATION

This application is a continuation-in-part of U.S. patent application Ser. No. 12/253,310, filed Oct. 17, 2008, which claims the benefit of U.S. Provisional Patent Application No. 60/999,527, filed Oct. 18, 2007. The entire disclosures of these applications are incorporated herein by reference.

GOVERNMENT RIGHTS

This invention was made with government support under Contract No. AFOSR #FA9550-06-1-0399 awarded by the Air Force Office of Scientific Research. The government has certain rights in the invention.

FIELD

The present disclosure relates to an electric device, and more particularly to a fiber-based electric device.

BACKGROUND

The statements in this section merely provide background information related to the present disclosure and may not constitute prior art.

Electric devices such as photovoltaic devices, thermoelectric devices, light emitting devices and the like have been developed for various uses. Typically, these devices are planar in shape and are relatively bulky, heavy, and rigid, which limits the usefulness of these devices. For instance, it can be difficult to incorporate these devices where space is limited, on non-planar base surfaces, and the like. Also, manufacturing an electronic device to make it smaller, lighter, and/or non-planar can be prohibitively expensive and may detrimentally effect the operating life of the device.

SUMMARY

A method of manufacturing a fiber-based electric apparatus is disclosed. The method includes providing an elongate, flexible fiber core and layering an electric device on the fiber core.

Also, a method of manufacturing an electric apparatus is disclosed. The method includes providing a plurality of fiber-based electric apparatuses, each including an elongate flexible fiber core and at least one electric device layered thereon. At least one of the plurality of fiber-based electric apparatuses includes a plurality of first films and second films. The first and second films are alternatingly arranged along the axis of the respective fiber core. The first films abut corresponding ones of the second films such that a plurality of junctions are defined between corresponding pairs of the first and second films. The method also includes operably securing the plurality of fiber-based electric apparatuses together into a mat that defines a first side and a second side such that a location of the plurality of junctions alternates in succession between the first side and the second side along the axis of the respective fiber core.

Moreover, a method of manufacturing an electric apparatus is disclosed. The method includes providing a plurality of fiber-based electric apparatuses, each including an elongate, flexible fiber core and at least one electric device layered thereon. The plurality of fiber-based electric apparatuses include a first fiber-based electric apparatus and a second fiber-based electric apparatus. The first fiber-based electric apparatus includes only one of a p-type material and an n-type material, and the second fiber-based electric apparatus includes only the other of the p-type material and the n-type material. The method further includes operably securing the plurality of fiber-based electric apparatuses together and electrically connecting the first and second fiber-based electric apparatuses together in parallel with at least one conductive member.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1A:
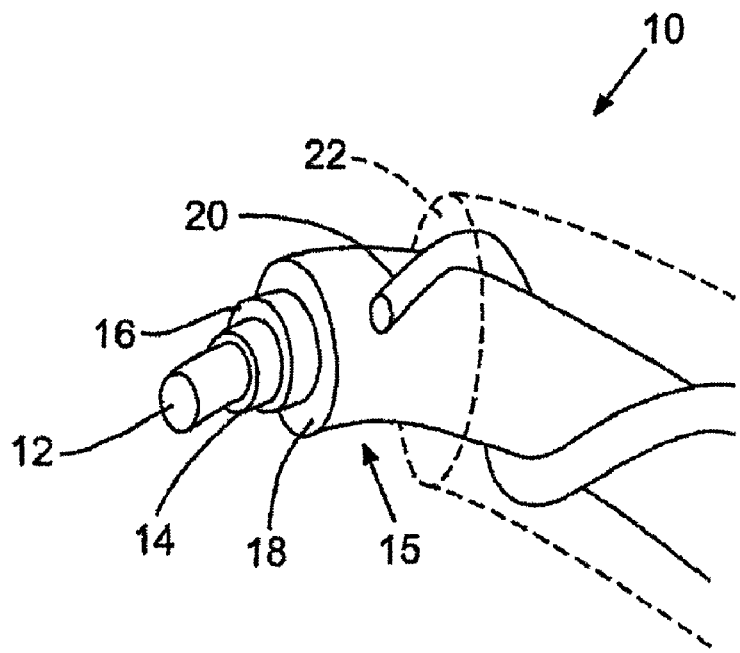
FIG. 1A is a perspective sectional view of a fiber-based electric apparatus according to the teachings of the present disclosure.

The following description is merely exemplary in nature and is not intended to limit the present disclosure, application, or uses. It should be understood that throughout the drawings, corresponding reference numerals indicate like or corresponding parts and features.

Figure 1B:
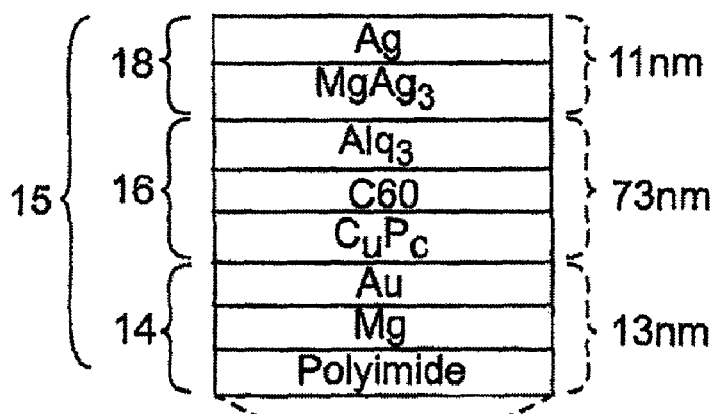
FIG. 1B is a cross sectional view of a fiber-based electric apparatus.
Figure 2:
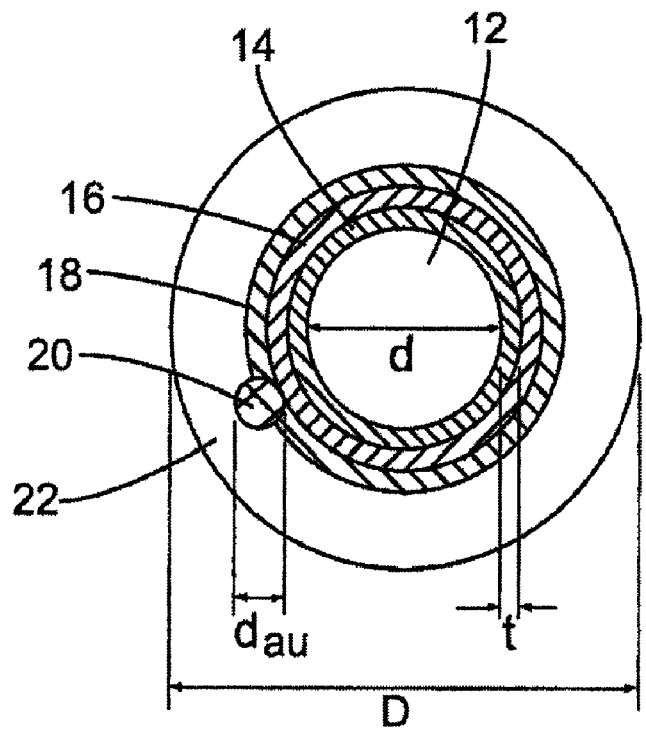
FIG. 2 is a cross sectional view of a fiber-based electric apparatus.

Referring now to FIGS. 1A, 1B and 2, one embodiment of a fiber-based electric apparatus is generally indicated at 10. Generally, the fiber-based electric apparatus 10 includes a flexible, fiber core 12 and an electric device, generally indicated at 15, that is layered on and supported by the fiber core 12. In some embodiments, the electric device 15 includes a plurality of layers as will be discussed. The electric device 15 can be flexible. As will be discussed, the fiber-based electric apparatus 10 can be relatively small, compact, and flexible and can be configured in a variety of ways for a wide variety of uses.

In the embodiments discussed in relation to FIGS. 1A, 1B, and 2, the electric device 15 functions as a photovoltaic (PV) device so as to convert light into electricity. However, as will be discussed, the electric device 15 can have various other functions without departing from the scope of the present disclosure.

In this embodiment, the fiber-based electric apparatus 10 is a photovoltaic (PV) device and is operable for converting light into electricity; however, the apparatus 10 could be of any other suitable type as will be discussed. As shown, the apparatus 10 includes an elongate, flexible fiber core 12.

Figure 1B:
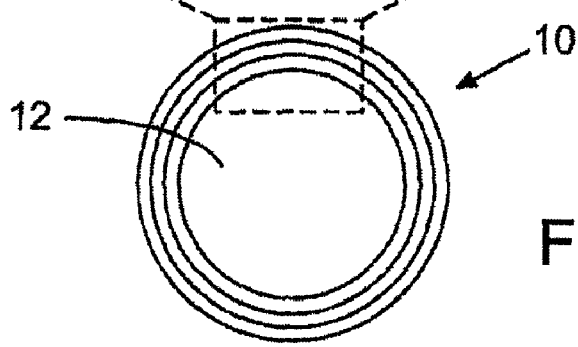

In one embodiment, the core 12 is made out of aluminum or aluminum-coated fiber. However, the core 12 could be made out of any suitable material. In the embodiments of FIGS. 1A-2, the electric device 15 functions independent of the fiber core 12. Thus, the core 12 provides structural support for the device 15, and the device 15 operates substantially independently. In other embodiments, the electric device 15 functions in combination with the fiber core 12. For instance, the core 12 can be an electric conductor for the electric device 15 in addition to providing structural support.

In the embodiments of FIGS. 1A-2, the electric device 15 includes a plurality of layers. More specifically, the device 15 includes an anode 14 layered on the core 12. In one embodiment, the anode 14 includes a conductive polymer. Next, an organic layer 16 (i.e., an organic bulk heterojunction) is layered on the anode 14. In one embodiment, the organic layer 16 includes at least one organic material. Also, a cathode 18 is layered on the organic layer 16. In one embodiment, the cathode 18 includes a conductive polymer. The cathode 18 can also have anti-reflection properties to thereby control optical interference inside the organic layer 16.

Additionally, in some embodiments, the device 15 includes an auxiliary conducting wire 20. The conducting wire 20 is helically wound on the outside of the cathode 18 at a relatively low duty cycle. The conducting wire 20 is in electric contact with the cathode 18 and acts as a bus line to facilitate transmission of electricity along the cathode 18. In other embodiments, the wire 20 extends substantially parallel to the axis of the core 12 instead of being wound helically about the device 15.

Furthermore, in some embodiments, the fiber-based electric apparatus 10 includes an encapsulating layer 22 (shown in phantom in FIG. 1A). The encapsulating layer 22 is included over the cathode 18 and the conducting wire 20 for protection against abrasion and environmental resistance. In some embodiments, the encapsulating layer 22 is substantially transparent.

As shown in FIG. 2, the organic layer 16 (i.e., the active layers) and the electrodes (i.e., the anode 14 and the cathode 18) are coaxially aligned on the core 12. In the embodiment shown, the core 12 has a diameter d, and the anode 14 is a metallic layer of a thickness t (FIG. 2). Also, the organic layer 16 is a thin (e.g., approximately 1-200 nm) coating of photoactive organic material. Furthermore, the cathode 18 is a conducting polymer. The auxiliary conducting wire 20 has a thickness $d_{aux}$, and is helically wound around the other layers at a relatively low duty cycle. The encapsulating layer 22 is included to give the entire apparatus 10 a thickness of D.

FIG. 1B is a cross sectional view of an exemplary embodiment of the apparatus 10. It will be appreciated that the materials and the thickness dimensions discussed in relation to this embodiment are merely exemplary and non-limiting, and the apparatus 10 can include any suitable materials with any suitable dimensions without departing from the scope of the present disclosure. In this embodiment, the anode 14 includes individual layers of polyimide, magnesium, and gold layered on the core 12 at a total thickness of approximately 13 nm. Next, the organic layer 16 includes individual layers of CuPc, C60, and $Alq_3$ layered on the anode 14 at a total thickness of approximately 73 nm. Finally, the cathode 18 includes individual layers of MgAg and silver layered on the organic layer 16 at a total thickness of approximately 11 nm.

Figure 3:
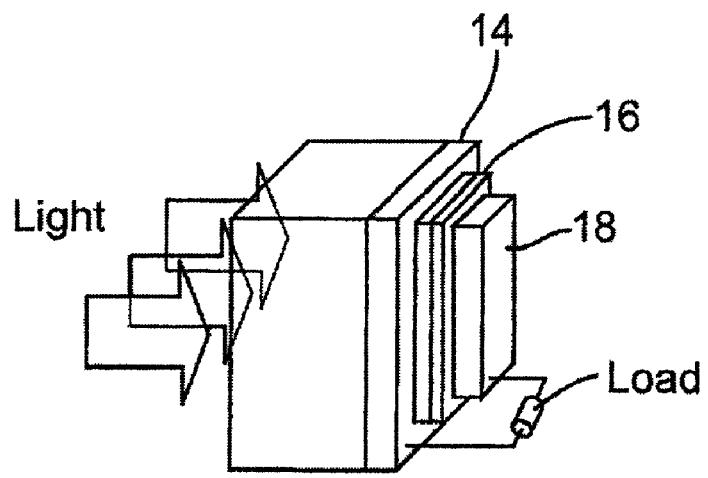
FIG. 3 is a schematic view of a fiber-based electric device of FIGS. 1A-2.
Figure 4:
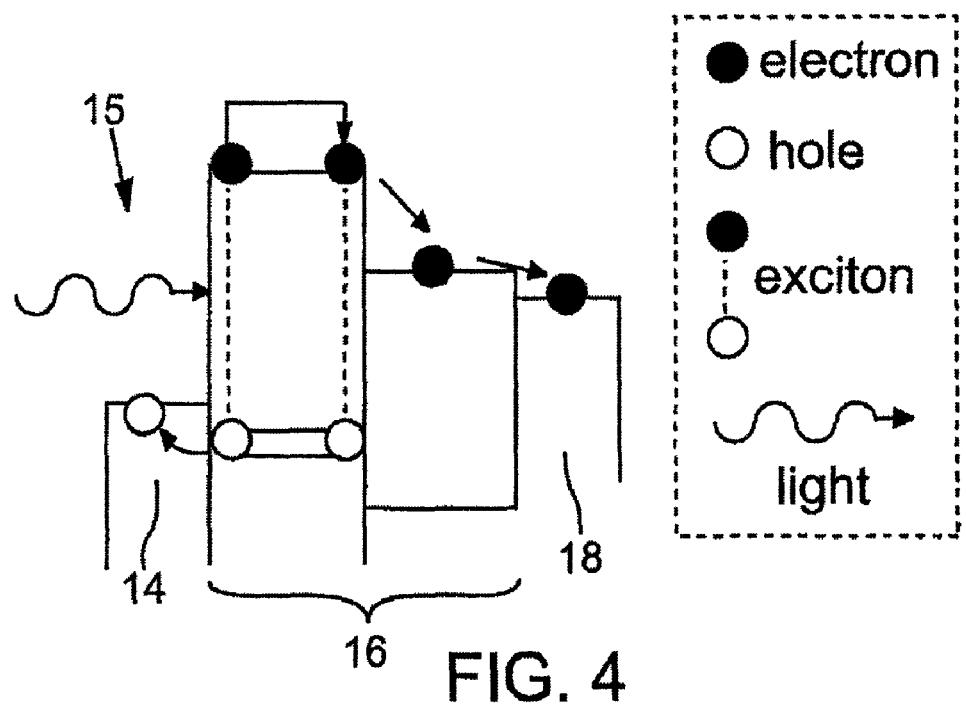
FIG. 4 is a schematic view of the operation of the fiber-based electric device of FIGS. 1A-2.

FIGS. 3 and 4 schematically illustrate the operation of the device 15 to convert light into electricity. In the embodiment shown, the layers of the electric device 15 is represented with planar layers in FIGS. 3 and 4; however, it will be appreciated that the layers shown in FIGS. 3 and 4 represent the non-planar layers of the device 15 of FIGS. 1A-2. When light is exposed to the device 15, light absorption, exciton diffusion, exciton dissociation, and charge conduction occurs as is known in other prior art PV devices. As such, the light can be converted into electricity, and this electricity can be stored and/or be transferred to any other suitable load.

Figure 5:
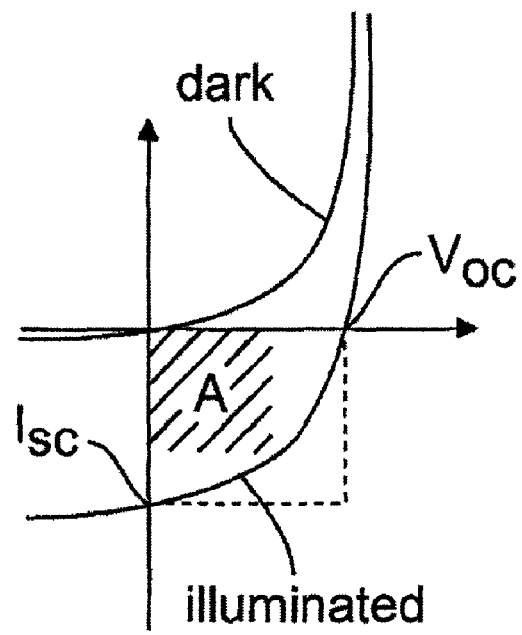
FIG. 5 is a graph of operative characteristics of the fiber-based electric device of FIGS. 1A-2.
Figure 7:
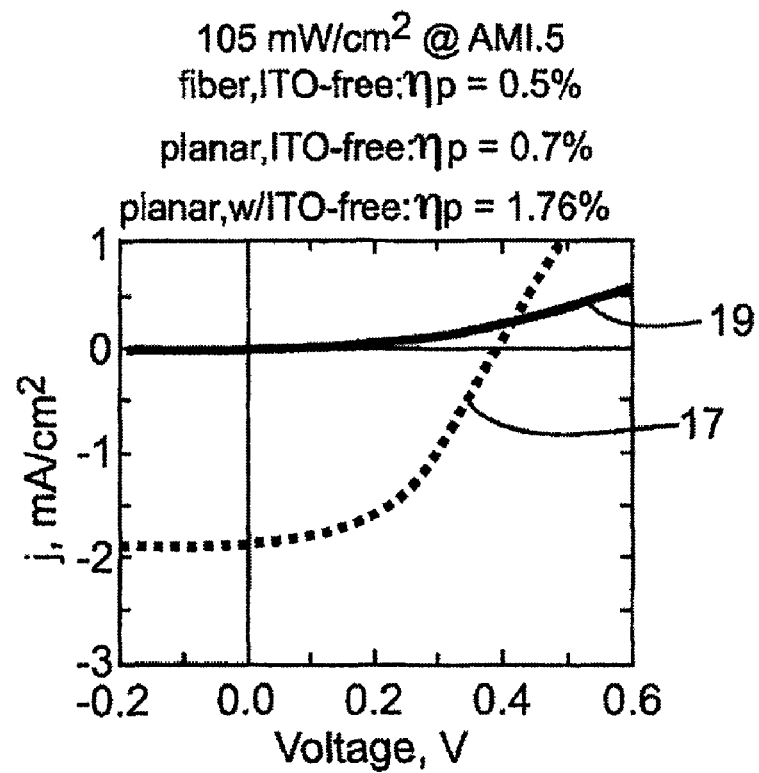
FIG. 7 is a graph comparing operative characteristics of planar-type photovoltaic devices versus the fiber-based photovoltaic devices according to the present disclosure.

Moreover, FIG. 5 is a representative plot of the typical current-voltage (I-V) behavior of the PV device 15, wherein FF represents fill factor, $V_{OC}$ represents open-circuit voltage, and $I_{SC}$ represents short-circuit current. Furthermore, FIG. 7 illustrates current density, j, versus voltage produced by the device 15 along with the conversion efficiency compared to conventional planar PV devices with and without indium tin oxide (ITO). In FIG. 7, line 19 represents operation in the dark, and line 17 represents operation under AM1.5 illumination.

It will be appreciated that the fiber-based electric apparatus 10 has improved mechanical flexibility, low weight, and thin layer structure as compared to conventional photovoltaic devices. Also, manufacturing of the apparatus 10 is facilitated, because each layer can be deposited on a non-planar and non-crystalline substrate as will be discussed. Furthermore, the apparatus 10 can be formed on a mechanically strong fiber core 12, allowing energy harvesting functionality to be integrated with load-bearing capability.

Figure 6:
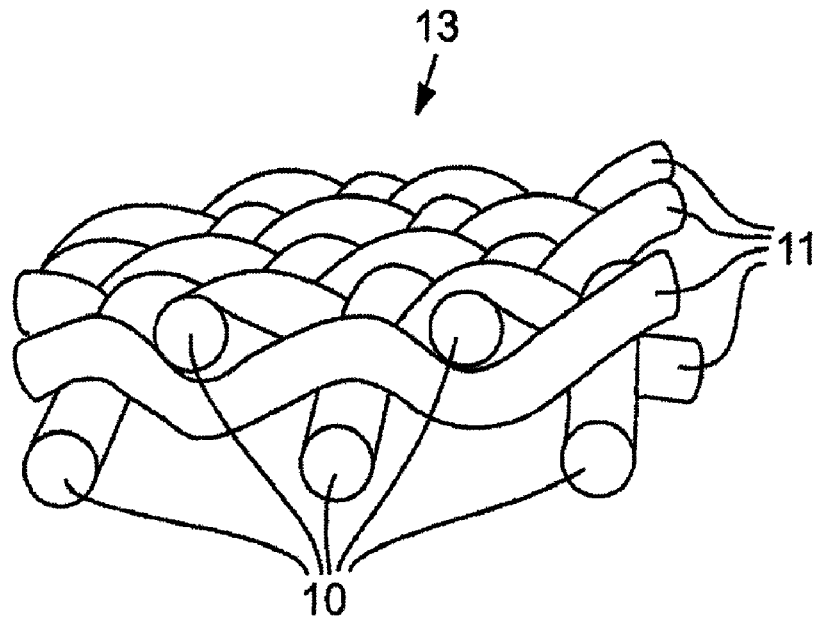
FIG. 6 is a perspective view of a woven mat that includes fiber-based photovoltaic apparatuses according to the present disclosure.

In addition, as shown in FIG. 6, a plurality of the fiber-based electric apparatuses 10 can be woven with other fibers 11 into a larger woven mat 13. Electric leads (not shown) can be electrically coupled to the respective fiber-based electric apparatuses 10 for transfer of the generated electricity. Accordingly, the mat 13 can be used to convert light into electricity. This can enable dramatically improved fabrication procedures for multifunctional structures and, in view of the high specific power density, provide added functionality without a significant weight penalty. Thus, the mat 13 can be directly integrated into existing materials and existing objects, such as vehicle bodies, etc. for harvesting energy. Accordingly, the capabilities of these materials and objects can be augmented without sacrificing desired properties such as strength or flexibility or causing detrimental effects, such as a significant addition of weight.

Figure 8A:
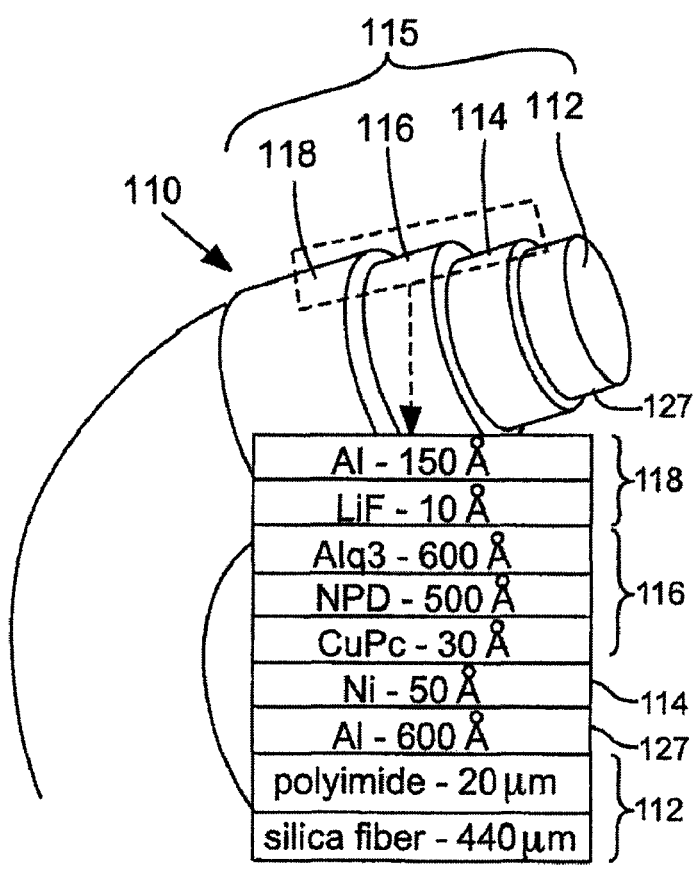
FIG. 8A is a perspective sectional view of an exemplary embodiment of a fiber-based OLED electric apparatus according to the present disclosure.
Figure 8B:
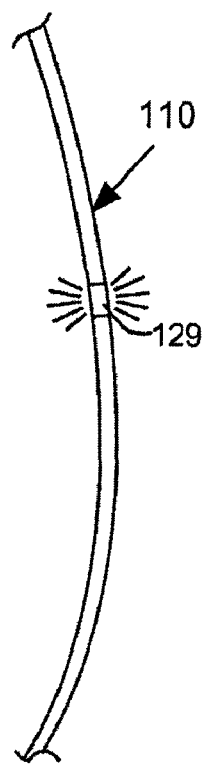
FIG. 8B is a top view of the fiber-based OLED of FIG. 8A in operation.

Now referring to FIGS. 8A and 8B, another embodiment of a fiber-based electric apparatus is generally indicated at 110. In this embodiment, the fiber-based electric apparatus 110 is a light emitting diode (LED) device that converts electricity into light. More specifically, the electric device is an organic LED device (i.e., an OLED device).

In the embodiment shown, the fiber-based electric apparatus 110 includes a core 112. Also, an anode 114 is layered on the core 112, an organic layer 116 is layered on the anode 114, and a cathode 118 is layered on the organic layer 116. Furthermore, in some embodiments, a conductor layer 127 is layered on the core 112 between the core 112 and the anode 114 for conducting electricity along the anode 114. In some embodiments, the anode 114 and/or the cathode 118 can include a plurality of layers with sufficient material to provide long-range conduction at relatively low resistive loss, and with a suitably treated surface to facilitate charge injection to or collection from the surrounding active layers.

FIG. 8A illustrates one embodiment of the materials and dimensions of the core 112, anode 114, organic layer 116, and cathode 118. However, it will be appreciated that these components can be of any suitable type and dimension without departing from the scope of the present disclosure.

In the embodiment of FIG. 8A, the core 112 includes a silica fiber having a diameter of approximately 440 µm that is layered with polyimide having a wall thickness of approximately 20 µm. The conductor layer 127 can be made of aluminum at a wall thickness of approximately 600 angstroms. Furthermore, the anode 114 can be made of nickel at a thickness of approximately 50 angstroms. In some embodiments, the anode 114 is oxidized nickel, which is oxidized using UV-ozone to lower the work function of the anode 114. The organic layer 116 can include CuPc at a thickness of approximately 30 angstroms, NPD at a thickness of approximately 500 angstroms, and $Alq_3$ at a thickness of approximately 600 angstroms. Moreover, the cathode 118 can include LiF at a thickness of approximately 10 angstroms, and aluminum at a thickness of approximately 150 angstroms.

As shown in FIG. 8B, the electric device 115 can be localized along the length of the fiber-based electric apparatus 110 to define a localized pixel 129. The pixel 129 can emit light (e.g., a green light) when electricity is transmitted through the conductor layer 127 and there is a voltage between the cathode 118 and anode 114/conductive layer 127. More specifically, this causes charges to be injected into the organic layer 116 (the active layer), and light is emitted.

Figure 9A:
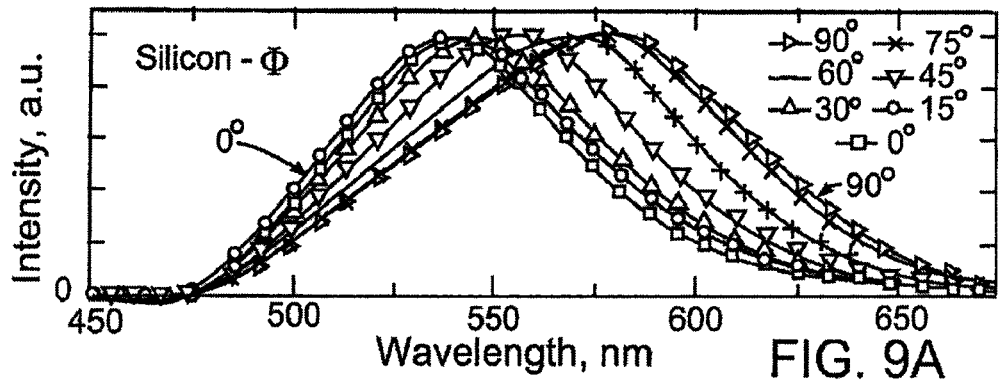
FIGS. 9A-9D are graphs illustrating various OLEDs including the fiber-based OLED of FIGS. 8A-8B.
Figure 9B:
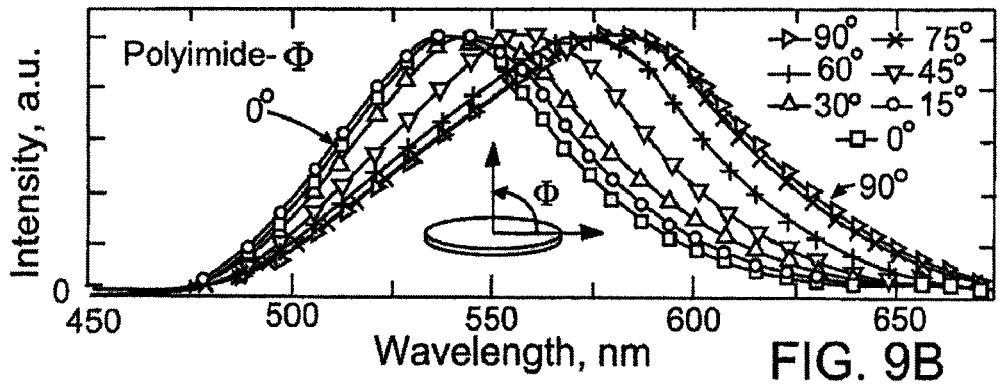
Figure 9C:
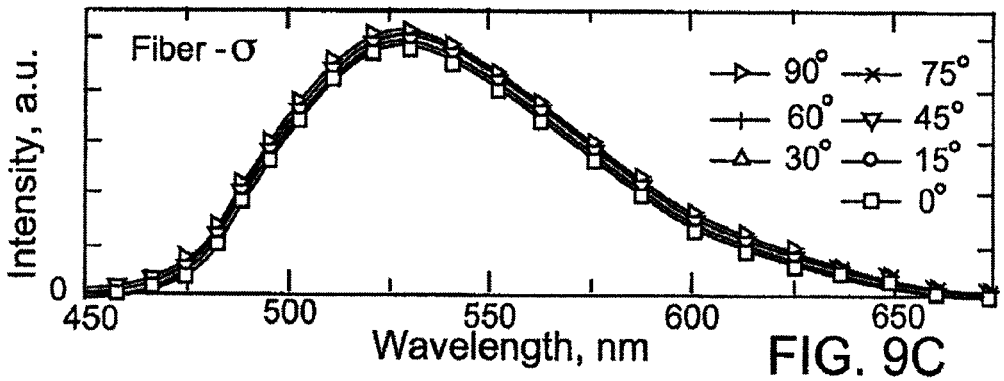
Figure 9D:
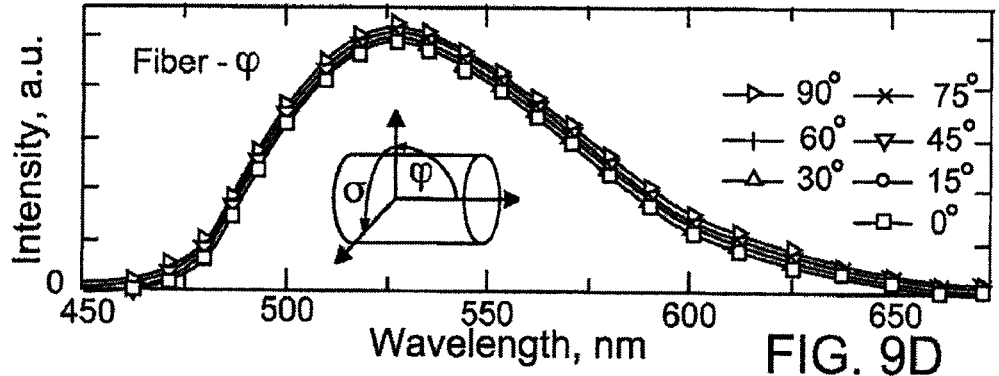

It will be appreciated that the pixel 129 can emit light substantially equally from all angles about the axis of the fiber-based electric apparatus 110 (i.e., the observation angle). FIGS. 9A-9D show emission spectra showing the variation of light depending on the observation angle. FIG. 9A represents a planar top-emitting OLEDs on a silicon substrate, FIG. 9B represents a planar top-emitting OLED on polyimide substrate, FIG. 9C represents the fiber-based electric apparatus 110 of FIG. 8A with variation in azimuthal angle θ, and FIG. 9D represents the fiber-based electric apparatus 110 of FIG. 8A with variation in zenith angle φ. Normal emission is taken as 90° and the inset schematics illustrate the direction of angular variation. As shown in FIGS. 9C and 9D, the spectral character of the fiber-based electric apparatus 110 is substantially invariant to observation angle in contrast to the strong angular dependence observed in the planar devices of FIGS. 9A and 9B.

Figure 10:
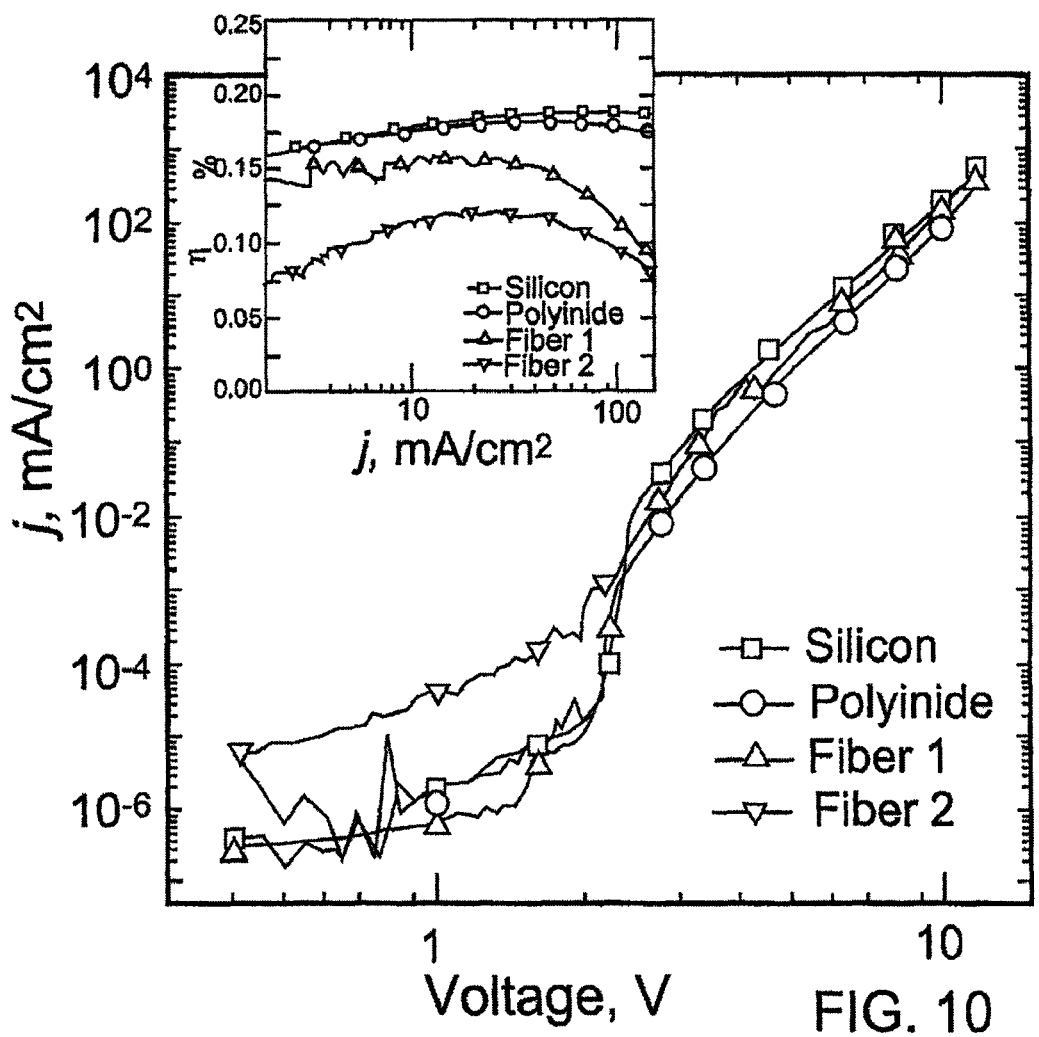
FIG. 10 is a graph illustrating various OLEDs including the fiber-based OLED of FIGS. 8A-8B.

FIG. 10 illustrates current density-voltage (j-V) characteristics and external quantum efficiency of the fiber-based apparatus 110 (FIGS. 9C, 9D) and of the planar OLEDs deposited on silicon and polyimide substrates (FIGS. 9A, 9B). The similar behavior between these devices suggests comparable organic layer thicknesses. One of the fiber-based OLED apparatuses 110 exhibits increased leakage current, attributed to substrate surface roughness leading to increased current shunt pathways. This suggests that a substrate "smoothing" step can be incorporated into the manufacturing technique for producing the fiber-based apparatus 110 as will be discussed.

Moreover, FIGS. 9A-10 show that the fiber-based apparatus 110 exhibits substantially equal current-voltage behavior to the planar OLED devices of FIGS. 9A and 9B and have comparable quantum efficiency, while at the same time achieving uniform emission spectrum regardless of observation angle. As such, the fiber-based apparatus 110 can be used in various applications, such as light-emitting (communications) composites, fabrics, etc.

Figure 11:
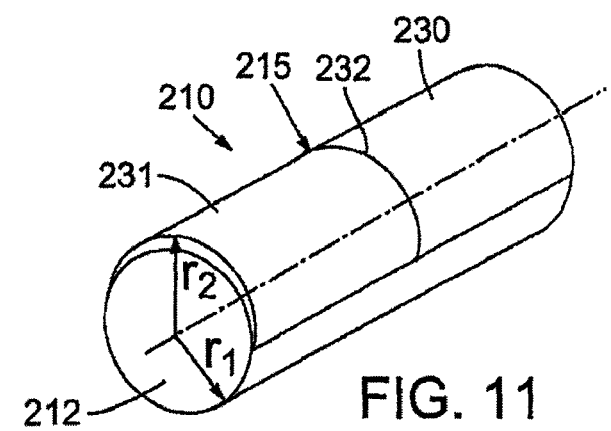
FIG. 11 is a perspective sectional view of an exemplary embodiment of a fiber-based thermoelectric apparatus according to the present disclosure.
Figure 12:
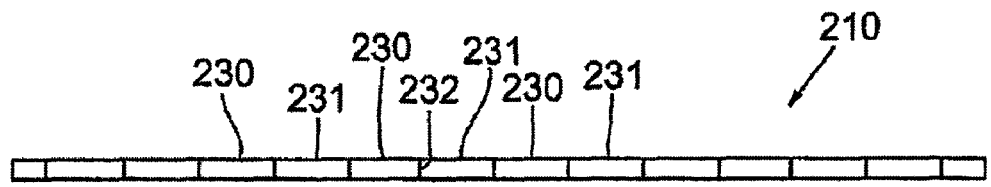
FIG. 12 is a side view of the fiber-based thermoelectric apparatus of FIG. 11.

Now referring to FIGS. 11 and 12, another embodiment of a fiber-based electric apparatus is generally indicated at 210. In this embodiment, the electric apparatus 210 is a thermoelectric (TE) device that converts heat to electricity or converts electricity to heat (directionally) as will be discussed.

In one embodiment, the fiber-based electric apparatus 210 includes a core 212. In one embodiment, the core 212 is a polyimide-coated silica fiber having a diameter of approximately 500 µm.

Also, as shown in FIGS. 11 and 12, the fiber-based electric apparatus 210 includes an electric device 215 that is layered on and supported by the core 212. The electric device 215 includes a first film 230 and a second film 231. The first and second films 230, 231 are disposed in spaced relationship along the axis of the core 212. More specifically, the films 230, 231 are alternatingly disposed in strips on the core 212 along the axis of the core 212. Also, in some embodiments represented in FIG. 11, the first and second films 230, 231 cover only a portion of the core 212 and leave another portion of the core 212 exposed. For instance, in the embodiment of FIG. 11, the films 230, 231 cover approximately half of the core 212 and leave the other half exposed.

In one embodiment, the first film 230 is made of silver and the second film 231 is made of nickel, and each individual strip is approximately 5 mm long. Also, in one embodiment, the first and second films 230, 231 have a maximum thickness $(r_2-r_1)$ of approximately 120 nm. It will be appreciated that the thickness of the films 230, 231 can vary over a wide range (e.g. from nanometers to microns). In some embodiments, the thickness of the films 230, 231 has an approximately linearly proportional effect on the power produced or dissipated by the individual fiber-based electric apparatus 210. In selecting the thickness of the first and second films 230, 231, film continuity can be achieved, while still allowing the apparatus 210 to be relatively flexible.

Also junctions 232 are defined where the first film 230 and second film 231 abut and/or overlap. In one embodiment, the junctions 232 overlap at a length of approximately 0.5 mm.

In one embodiment of the manufacturing technique of the apparatus 210, the core 212 is masked in predetermined areas, and the first film 230 is deposited by a well known thermal evaporation process under a vacuum of $5 \times 10^{-7}$ torr. Then, the mask is moved to substantially cover the first film 230, and the second film 231 is deposited.

Figure 13:
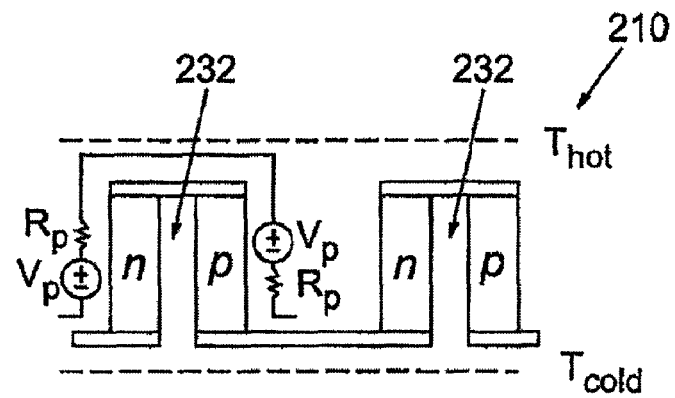
FIG. 13 is a schematic view of the fiber-based thermoelectric apparatus of FIG. 11.

It will be appreciated that the embodiment of the apparatus 210 represented in FIGS. 11 and 12 includes thermocouple p-n pairs with a "chain" of series-connected thermocouple junctions 232. Thus, the apparatus 210 can operate as a thermoelectric generator, in which cross-plane heat flow generates in-plane electric current as represented schematically in FIG. 13.

Figure 14A:
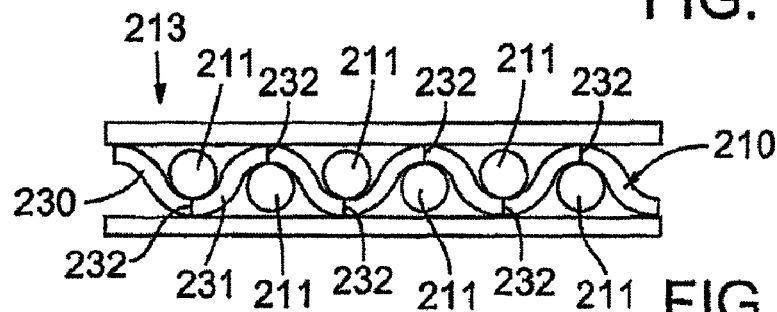
FIG. 14A is a sectional view of a woven mat that includes the fiber-based thermoelectric apparatus of FIG. 11.
Figure 14B:
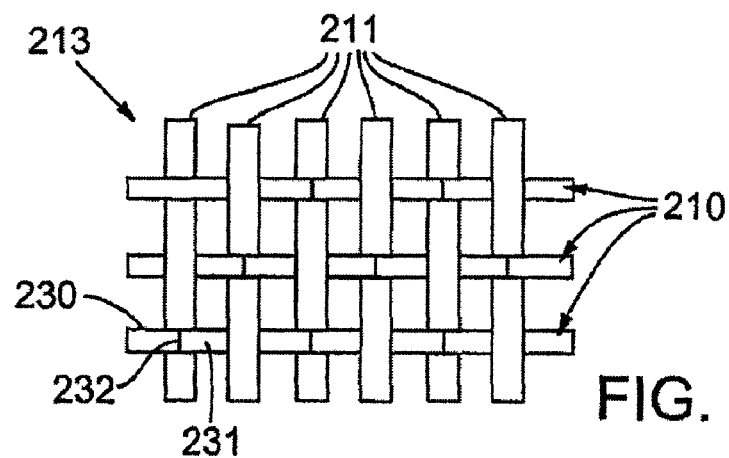
FIG. 14B is a top view of the woven mat of FIG. 14A.

Also, as represented in FIGS. 14A and 14B, the apparatus 210 can be woven with other fibers 211 into a mat 213 for various applications. As shown, the junctions 232 alternate between the top and bottom of the mat 213 along the axial length of the apparatus 210. Thus, each junction 232 produces a thermoelectric step in series voltage, and the core 212 provides structural support.

It will be appreciated that the mat 213 could be configured to operate as a thermoelectric generator. It will also be appreciated that the mat 213 could be configured to operate as a thermoelectric cooler, for instance, if external power is supplied to the mat 213.

Figure 15:
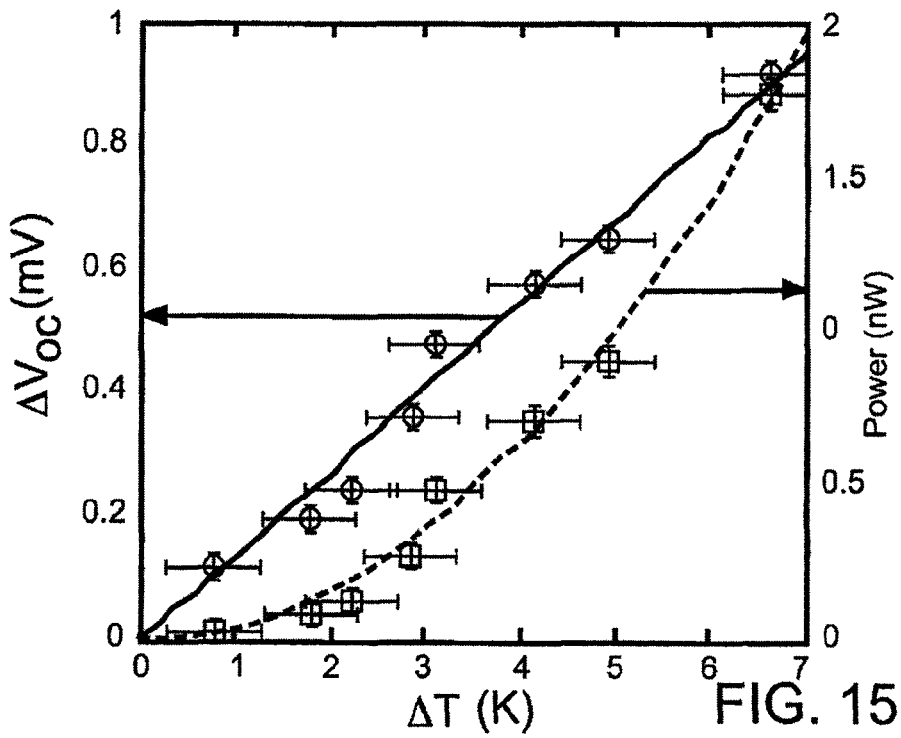
FIG. 15 is a graph illustrating the operating characteristics of the fiber-based thermoelectric apparatus of FIG. 11.
Figure 19:
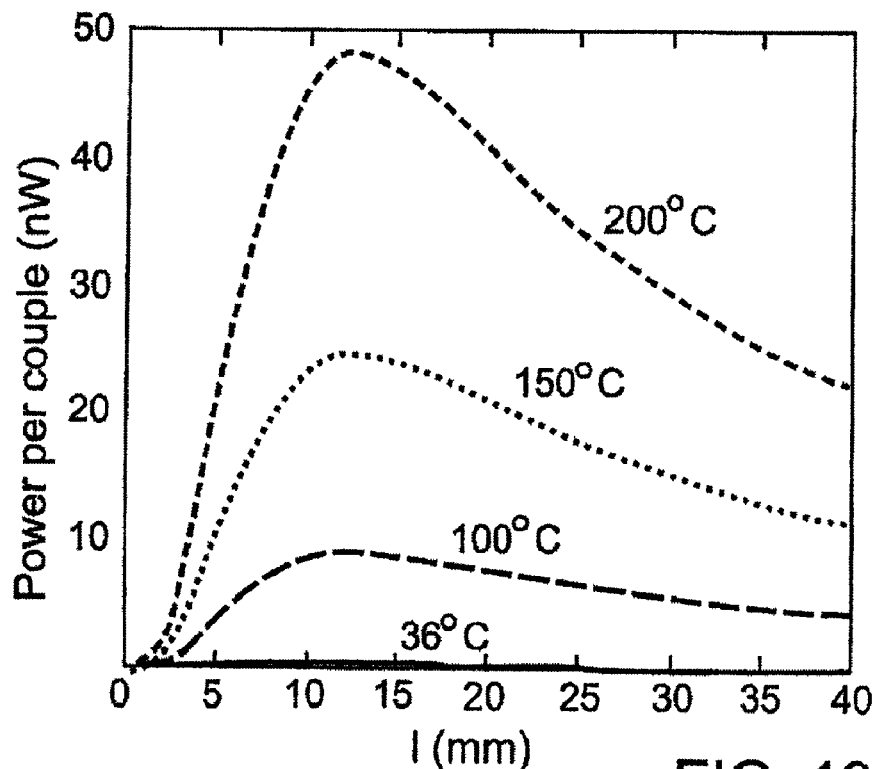
FIG. 19 is a graph illustrating the operating characteristics of the thermoelectric apparatus of the present disclosure.
Figure 20:
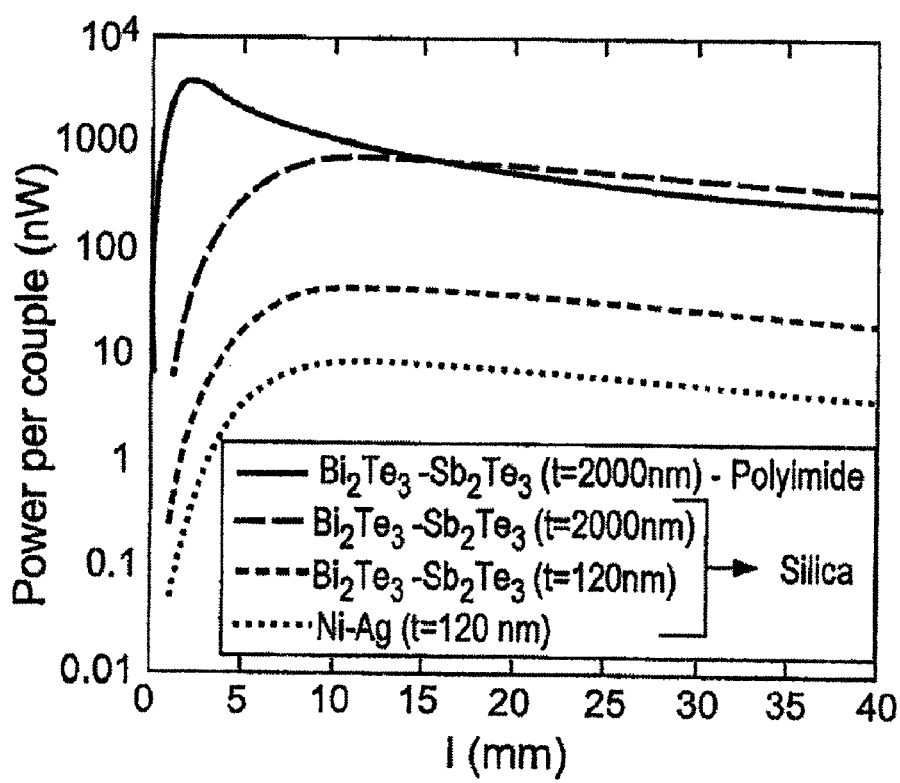
FIG. 20 is a graph illustrating the operating characteristics of the thermoelectric apparatus.

FIG. 15 is a plot of the open circuit voltage and power produced by one embodiment of the apparatus 210 for a given temperature gradient, $\Delta T$. FIG. 19 represents one embodiment of a power per couple versus the segment length for different hot junction temperatures in the apparatus 210. Moreover, FIG. 20 represents one embodiment of a comparison of power per couple from Ni—Ag thin films on a silica fiber substrate and $Bi_2Te_3$—$Sb_2Te_3$ thin films on silica and polyimide fiber substrates for temperature, $T_{hot}$ of 100° C.

Figure 16:
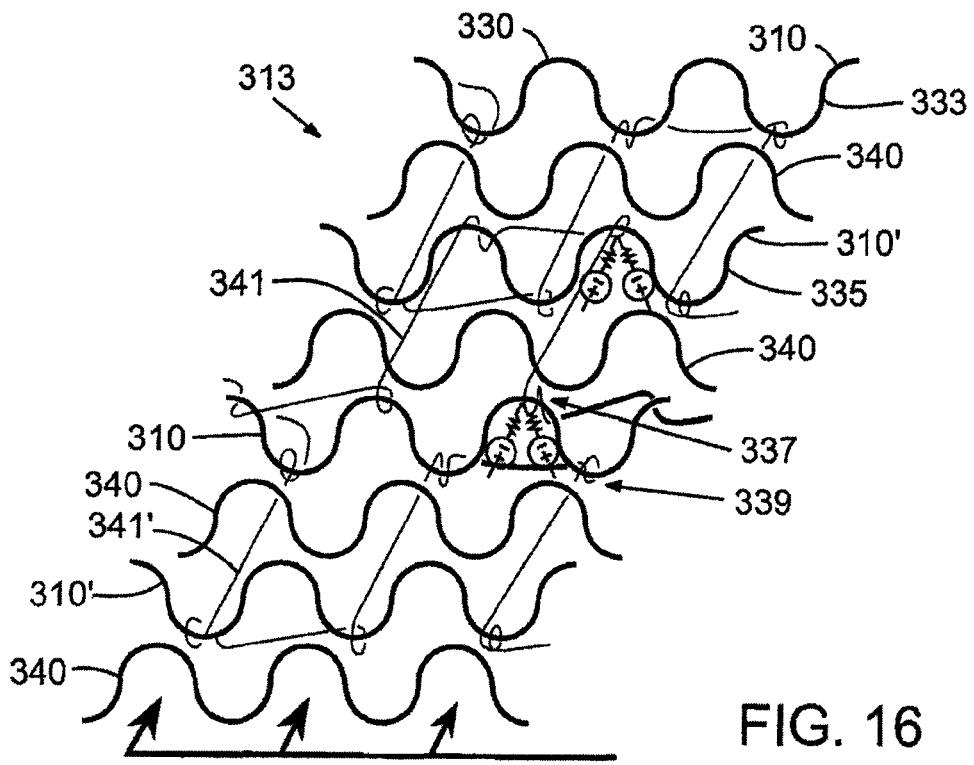
FIG. 16 is a schematic view of another embodiment of a woven mat that includes fiber-based thermoelectric apparatuses of the present disclosure.
Figure 17:
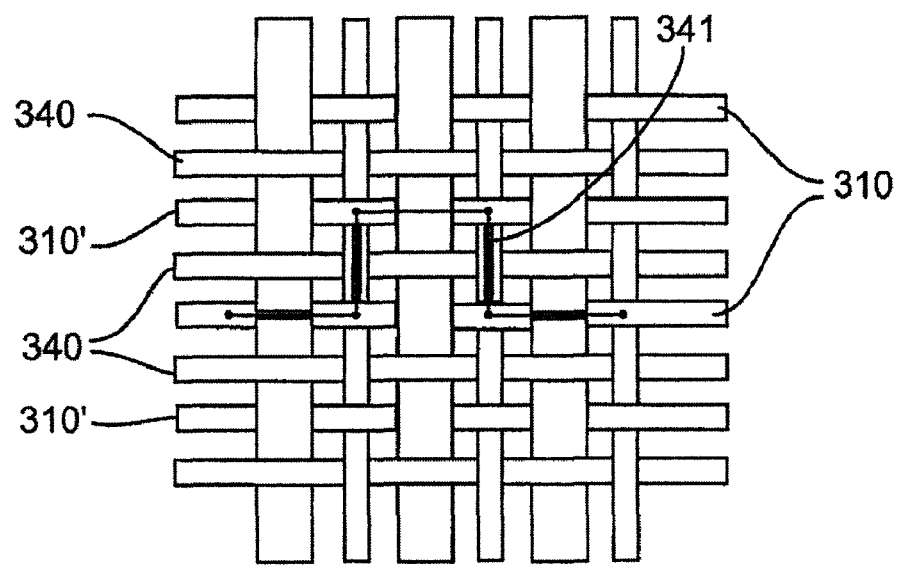
FIG. 17 is a top view of the woven mat of FIG. 16.
Figure 18:
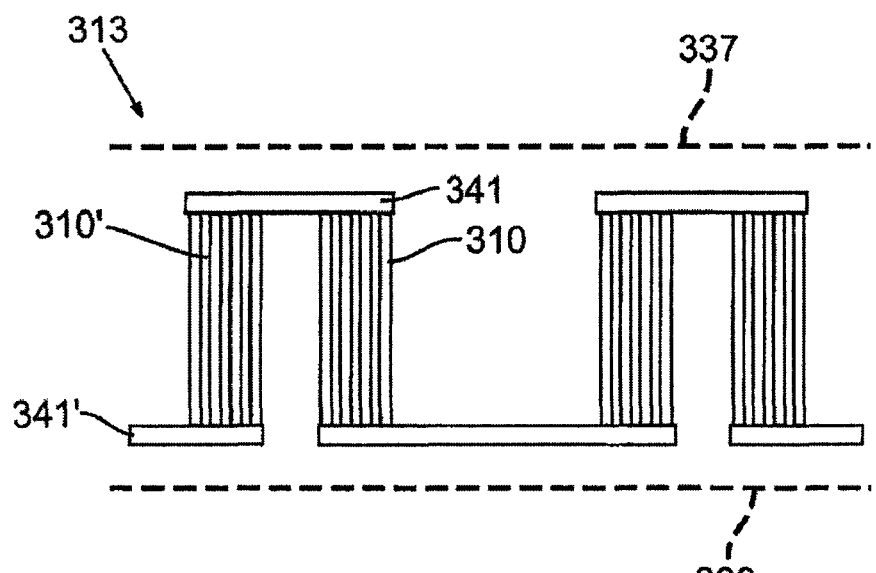
FIG. 18 is a schematic view of the woven mat of FIG. 16.

Referring now to FIGS. 16, 17, and 18, another embodiment of the mat 313 is illustrated, which includes a plurality of separate fiber-based electric apparatuses 310, 310'. In this embodiment, the mat includes a first fiber-based electric apparatus 310, a second fiber-based electric apparatus 310', a plurality of conductive members 341, 341', and a plurality of insulative fibers 340, which are woven together as discussed in greater detail below.

In some embodiments, the first fiber-based electric apparatus 310 includes a p-type first film 333 (a first thermoelectric component) uniformly layered and supported on its respective flexible, fiber core (not shown). Also, the second fiber-based electric apparatus 310' includes an n-type second film 335 (a second thermoelectric component) uniformly layered and supported on its respective flexible, fiber core (not shown). Additionally, in some embodiments, the insulating fiber 340 is a glass fiber or insulator-coated carbon fiber that provides load-bearing functionality to the mat 313. Furthermore, the conductive members 341, 341' can be made from any suitable conductive fiber or conductive ink.

When woven together into the mat 313, the apparatuses 310, 310' are alternatingly arranged in a side-by-side manner such that the respective axes of the apparatuses 310, 310' extend in substantially the same direction. Also, the insulating fibers 340 are each disposed between each of the apparatuses 310, 310' such that the respective axis of the insulating fiber 340 extends in substantially the same direction as the apparatuses 310, 310'. Furthermore, one or more conductive members 341 extends between and electrically connects adjacent pairs of the apparatuses 310, 310' along a hot side 337 of the mat 313. Moreover, one or more conductive members 341' extends between and electrically connects adjacent pairs of the apparatuses 310, 310' along a cold side 339 of the mat 313. In some embodiments, the conductive members 341, 341' extend generally parallel to the axes of the apparatuses 310, 310' and generally transverse to the axes of the apparatuses 310, 310'. It will be appreciated that the mat 313 can also include wrap fibers (not shown).

Thus, as represented schematically in FIG. 18, the mat 313 can operate as a thermoelectric generator in which the apparatuses 310, 310' (i.e., the n- and p-type elements) are connected in parallel. The conductive fibers 341 heat up, and the conductive fibers 341' cool down when power is supplied to the apparatuses 310, 310'.

In one embodiment, the mat 213 represented in FIGS. 14A and 14B and/or the mat 313 represented in FIGS. 16-18 can include at least one energy storage device (e.g., battery, capacitor). In one embodiment, the energy storage device is a fiber-based electric apparatus similar to the embodiments disclosed herein. The energy storage device is woven into the mat 213, 313 and provides energy to at least one of the respective apparatuses, 210, 310, 310'.

Furthermore in one embodiment, the apparatuses 210, 310, 310' include a protective coating (not shown) on an outer surface. The protective coating can protect against electrical shorting, abrasion of the active layers, and/or delamination of the active layers.

Figure 23A:
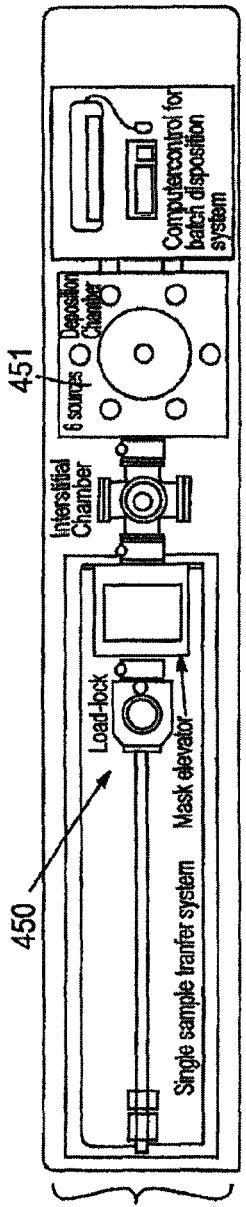
FIG. 23A is a schematic view of a machine for manufacturing a fiber-based electric apparatus.

The fiber-based electric apparatuses 10, 110, 210, 310, 310' can be manufactured in any suitable fashion. For instance, FIG. 23A is a detailed illustration of a first machine 450 for producing one or more of the fiber-based electric apparatuses 10, 110, 210, 310, 310'. The first machine 450 includes a deposition chamber 451. The deposition chamber 451 exposes the core 12, 112, 212, 312 of the apparatus 10, 110, 210, 310, 310' to the different materials described above to create the individual layers thereon.

Figure 21:
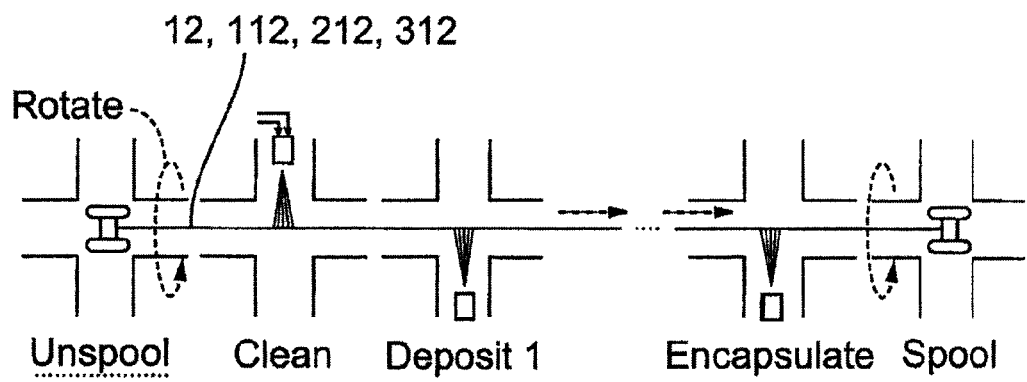
FIG. 21 is a schematic view of a manufacturing method for a fiber-based electric apparatus.
Figure 22:
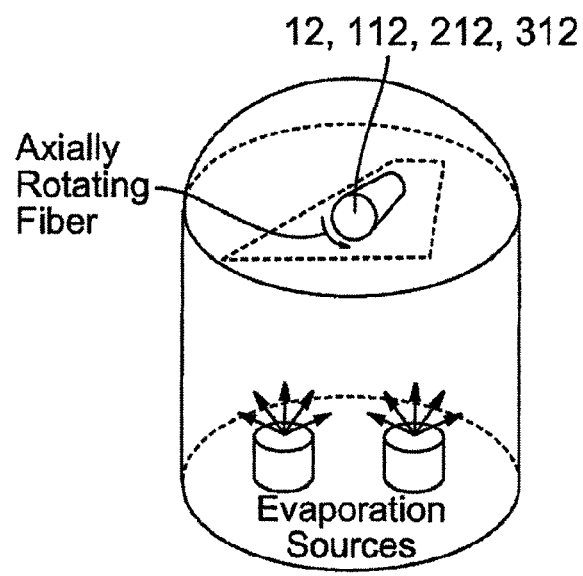
FIG. 22 is a schematic view of a manufacturing method for a fiber-based electric apparatus.
Figure 23B:
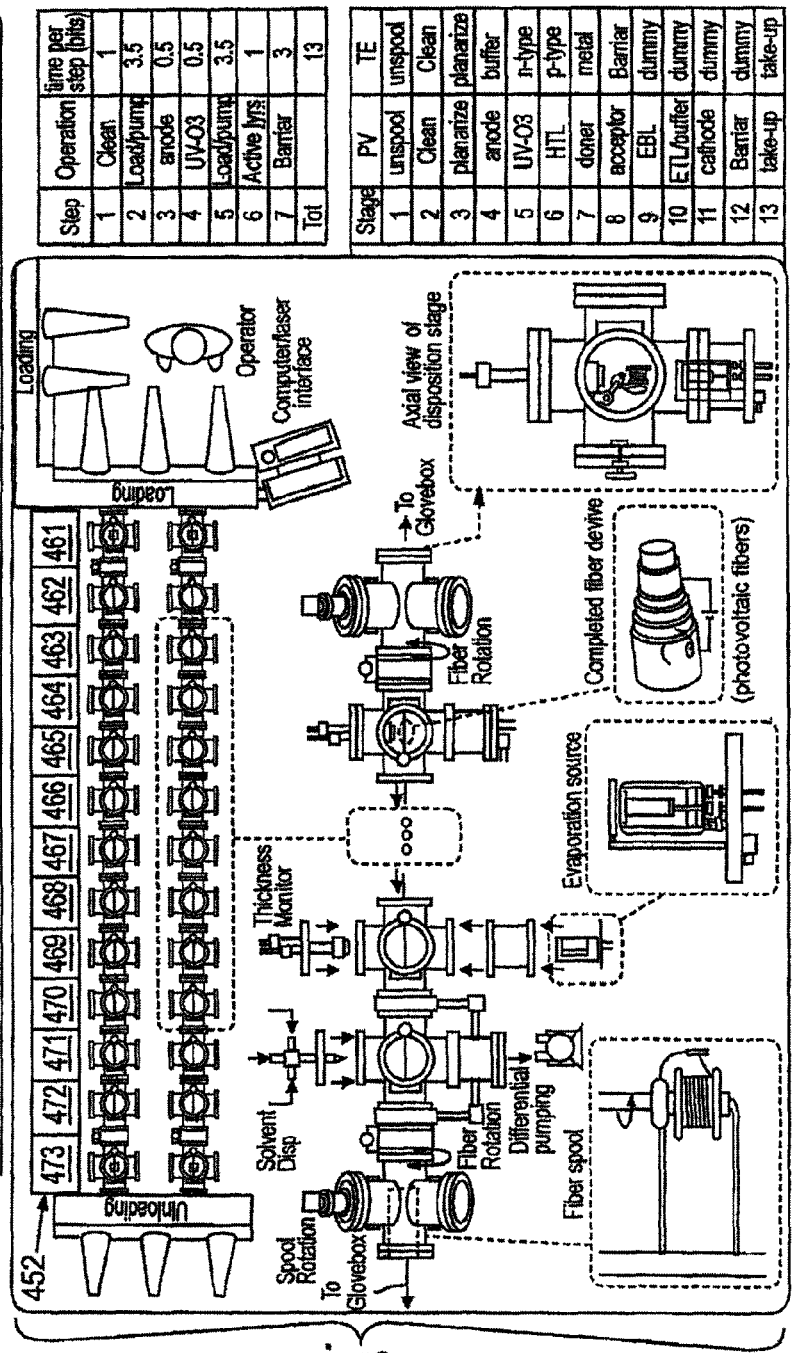
FIG. 23B is a schematic view of another machine for manufacturing a fiber-based electric apparatus.

FIGS. 21, 22, and 23B illustrate another manufacturing method for production of the fiber-based electric apparatuses 10, 110, 210, 310, 310'. As shown in FIG. 21, the method generally includes unspooling the fiber core 12, 112, 212, 312, cleaning the core 12, 112, 212, 312, passive and active material deposition, encapsulation using, for instance, the materials discussed above, and re-spooling of the apparatus 10, 110, 210, 310, 310'. The unspooling and re-spooling can advance the fiber core 12, 112, 212, 312 as the materials are deposited thereon. As shown in FIG. 22, the materials can be deposited using a vacuum thermal evaporation technique. Also, as shown in FIGS. 21 and 22, the core 12, 112, 212, 312 can be rotated about its longitudinal axis during this process to ensure even layering of the deposited materials.

FIG. 23B illustrates a second machine 452 for manufacture of the apparatuses 10, 110, 210, 310, 310'. In the embodiment shown, the second machine 452 includes a plurality of stages 461-473.

In the embodiment shown in FIG. 23B, the first and thirteenth stages 461, 473 have two ports dedicated to motorized spooling of the fiber and an atmosphere-vented port. Also, the second stage 462 has two ports dedicated to the jetting and collection of solvents and one port for aggressive pumping of solvent vapor. The third stage 463 is identical to the second stage 462, but uses a dissolved polymer for planarizing the fiber. The fourth stage 464 has one port outfitted with a quartz capillary gas inlet and a high-intensity UV lamp, and one port for aggressive pumping. The fifth through eleventh stages 465-471 each have one port outfitted with a quartz crystal microbalance, one port for evaporation of the source material, and one port for pumping. The evaporation source can be a temperature-controlled Radak effusion cell with a pneumatically-actuated beam shutter. Also, the power supply for the evaporation cell can be feedback-controlled with data from the enclosed thickness monitor. Moreover, the Radak sources can produce a highly collimated beam that results in high deposition flux, which is important for rapid device deposition. In addition, the twelfth stage 472 has one port with a two-zone heated capillary used for depositing a paralene-based barrier coating. The deposition occurs by first evaporating a paralene dimer at approximately 160° C., followed by a cracking at 600° C., and finally condensation/polymerization on the fiber.

In the embodiment shown, the second machine 452 is used to make a PV apparatus 10 of the type discussed above in relation to FIGS. 1A-2. However, it will be appreciated that the second machine 452 could be modified so as to manufacture any of the apparatuses 10, 110, 210, 310, 310' discussed above. For instance, in order to manufacture the apparatuses 210, 310, 310' discussed above, the second machine 452 includes analogous stages 461-473, albeit with some of the Radak sources operating at higher temperatures in order to effectively evaporate inorganic semiconductor and buffer materials.

Each stage is effectively isolated from others by virtue of localized pumping and a highly collimated deposition beam. Coating uniformity over the relatively large length of the fiber is achieved by means of control over evaporation rate and steady translation of the fiber, coupled with simultaneous rotation about the axis of the core 12, 112, 212, 312. It will be appreciated that the second machine 452 allows for significant reductions in manufacturing time for the apparatus 10, 110, 210, 310, 310'.

It will be appreciated that the electric apparatuses 10, 110, 210, 310, 310' disclosed above can be employed for various uses. For instance, these apparatuses 10, 110, 210, 310, 310' can be used for energy harvesting, solid state lighting, wearable displays, optical circuits, etc. Moreover, these fiber-based electric apparatuses 10, 110, 210, 310, 310' can be incorporated into vehicle bodies (e.g., flying vehicles) and other non-planar surfaces to enable the harvesting of light, heat, and vibrational energy that ordinarily affects the vehicle body. These apparatuses 10, 110, 210, 310, 10, 110, 210, 310, 310' can also be used to generate light and/or heat.

The description of the invention is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A method of manufacturing an electric apparatus comprising:
   providing a plurality of fiber-based electric apparatuses, each including an elongate flexible fiber core and at least one electric device layered thereon, at least one of the plurality of fiber-based electric apparatuses including a plurality of first films and second films, the first and second films alternatingly arranged along the axis of the respective fiber core, the first films abutting corresponding ones of the second films such that a plurality of junctions are defined between corresponding pairs of the first and second films; and
   operably securing the plurality of fiber-based electric apparatuses together into a mat that defines a first side and a second side such that a location of the plurality of junctions alternates in succession between the first side and the second side along the axis of the respective fiber core.

2. The method of claim 1, wherein operably securing includes weaving the plurality of fiber-based electric apparatuses together into the mat.

3. The method of claim 1, further comprising at least one of converting electricity to light with the electric apparatus, converting light to electricity with the electric apparatus, converting heat to electricity with the electric apparatus, and converting electricity to heat with the electric apparatus.

4. The method of claim 3, further comprising at least two of operating the electric apparatus as a photovoltaic device, a thermoelectric device, and a light emitting device.

5. The method of claim 1, wherein operably securing includes placing at least one of the fiber-based electric apparatuses in electric communication with another of the fiber-based electric apparatuses.

6. The method of claim 1, further comprising interweaving a plurality of secondary fibers with the plurality of fiber-based electric apparatuses such that the secondary fibers each extend transverse to the axis of the respective fiber core and such that the secondary fibers each overlay a respective one of the plurality of junctions.

7. The method of claim 1, wherein providing a plurality of fiber-based electric apparatuses includes providing the flexible fiber core and layering the at least one electric device on the fiber core.

8. The method of claim 7, further comprising unspooling the elongate, flexible fiber core and spooling the elongate-flexible fiber core to advance the fiber core during layering of the electric device on the fiber core.

9. The method of claim 7, further comprising rotating the elongate, flexible fiber core about an axis of the elongate, flexible fiber core while layering the electric device on the fiber core.

10. The method of claim 7, further comprising layering the at least one electric device via vacuum thermal evaporation.

11. A method of manufacturing an electric apparatus comprising:
    providing a plurality of fiber-based electric apparatuses, each including an elongate, flexible fiber core and at least one electric device layered thereon, the plurality of fiber-based electric apparatuses including a first fiber-based electric apparatus and a second fiber-based electric apparatus, the first fiber-based electric apparatus including only one of a p-type material and an n-type material, the second fiber-based electric apparatus including only the other of the p-type material and the n-type material;
    operably securing the plurality of fiber-based electric apparatuses together; and
    electrically connecting the first and second fiber-based electric apparatuses together in parallel with at least one conductive member.

12. The method of claim 11, wherein operably securing the plurality of fiber-based electric apparatuses together includes operably securing the plurality of fiber-based electric apparatuses together into a mat that defines a first side and a second side, and wherein electrically connecting the first and second fiber-based electric apparatuses together includes operatively connecting pairs of the first and second fiber-based electric apparatuses with a first conductive member adjacent the first side of the mat, and wherein electrically connecting the first and second fiber-based electric apparatuses together includes operatively connecting pairs of the first and second fiber-based electric apparatuses with a second conductive member adjacent the second side of the mat.

13. The method of claim 11, further comprising positioning an insulating fiber between a pair of the first and second fiber-based electric apparatuses.

14. The method of claim 11, wherein operably securing the plurality of fiber-based electric apparatuses together includes weaving the plurality of fiber-based electric apparatuses together.

15. The method of claim 11, further comprising at least one of converting electricity to light with the electric apparatus, converting light to electricity with the electric apparatus, converting heat to electricity with the electric apparatus, and converting electricity to heat with the electric apparatus.

16. The method of claim 15, further comprising at least two of operating the electric apparatus as a photovoltaic device, a thermoelectric device, and a light emitting device.

17. The method of claim 11, wherein providing a plurality of fiber-based electric apparatuses includes providing the flexible fiber core and layering the at least one electric device on the fiber core.

18. The method of claim 17, further comprising unspooling the elongate, flexible fiber core and spooling the elongate-flexible fiber core to advance the fiber core while layering the at least one electric device on the fiber core.

19. The method of claim 17, further comprising rotating the elongate, flexible fiber core about an axis of the elongate, flexible fiber core while layering the at least one electric device on the fiber core.

20. The method of claim 17, further comprising layering the at least one electric device via vacuum thermal evaporation.

* * * * *